United States Patent [19]
Phillips et al.

[11] Patent Number: 5,268,636
[45] Date of Patent: Dec. 7, 1993

[54] MMIC PACKAGE AND INTERCONNECT TEST FIXTURE

[75] Inventors: Kurt R. Phillips, Lafayette; Dylan F. Williams, Boulder, both of Colo.

[73] Assignee: The United States of America as represented by the Secretary of Commerce, Washington, D.C.

[21] Appl. No.: 847,489

[22] Filed: Mar. 10, 1992

[51] Int. Cl.⁵ ............................................. G01R 19/10
[52] U.S. Cl. .............................. 324/158 F; 324/158 P
[58] Field of Search ............. 324/158 R, 158 F, 72.5, 324/158 P; 333/246, 1, 33, 247

[56] References Cited

U.S. PATENT DOCUMENTS

| | | | |
|---|---|---|---|
| 4,704,872 | 11/1987 | Jones | 62/3 |
| 4,897,601 | 1/1990 | Hirsch et al. | 324/158 F |
| 4,947,111 | 8/1990 | Higman et al. | 324/158 F |
| 4,980,636 | 12/1990 | Romanofsky et al. | 324/158 F |
| 5,041,782 | 8/1991 | Marzan | 324/158 F |
| 5,051,810 | 9/1991 | Katoh | 357/68 |
| 5,151,652 | 9/1992 | Moschuering | 324/158 F |

OTHER PUBLICATIONS

G. G. Engen, "A Bolometer Mount Efficiency Measurement Technique", *Journal of Research of the National Bureau of Standards*, vol. 65C No. 2, Apr.-Jun. 1961.

B. D. Geller, "A Broadband Microwave Test Fixture": *Microwave Journ.* vol. 30, No. 5, May 1987, pp. 233-248.

R. F. Bauer and P. Penfield, "De-embedding and Unterminating", *IEEE Transactions on Microwave Theory and Techniques*, vol. MTT-22, No. 3, pp. 282-288, Mar. 1974.

*Primary Examiner*—Vinh Nguyen
*Attorney, Agent, or Firm*—Ross F. Hunt, Jr.

[57] ABSTRACT

A test fixture is provided for determining electrical characteristics such as the S-parameters of a MMIC package or interconnect. The fixture enables the measurement, in effect, of multiple standards using only the single test fixture and also accommodates variable port-to-port spacings. The test fixture comprises a U-shaped conductive ground plane having parallel arms defining a space therebetween. A center conductor is located in the space and is disposed in spaced relationship to the arms of the ground plane. A beam lead PIN diode is connected to the center conductor at one end thereof and to the ground plane at the other. An external variable DC voltage source is used to vary the bias state of the diode so that when the fixture is inserted into a package or interconnect, reflection coefficient measurements for the different bias states can be obtained by an automatic network analyzer for use in calculations for determining the characteristics in question.

12 Claims, 2 Drawing Sheets

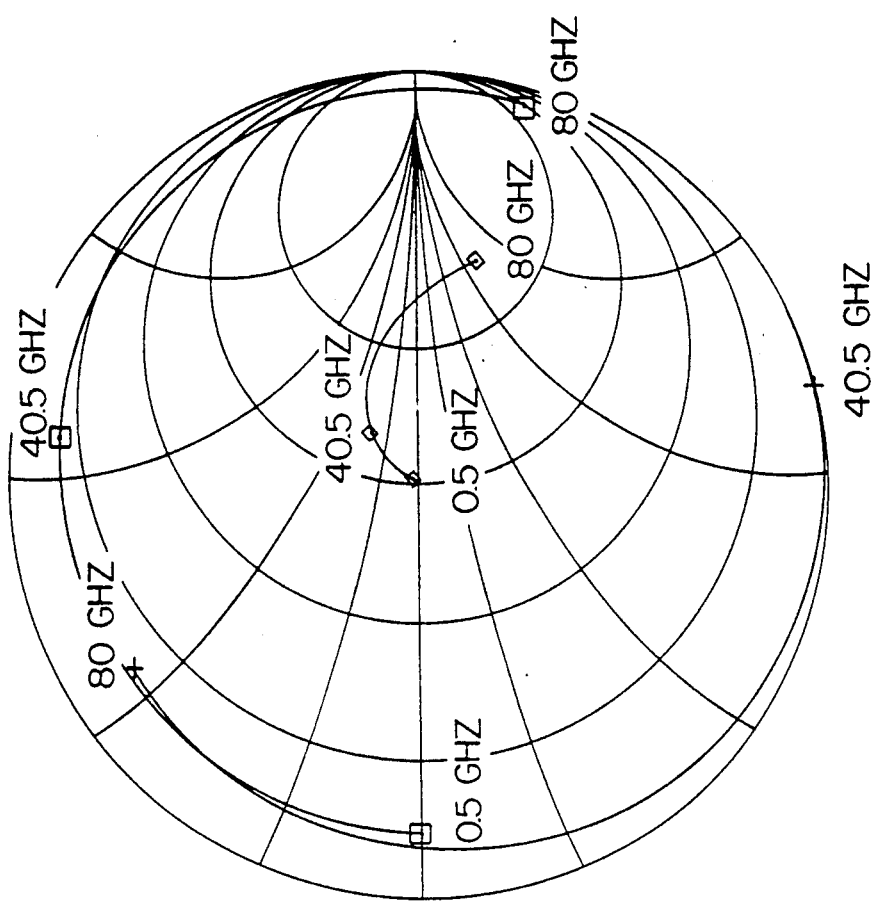
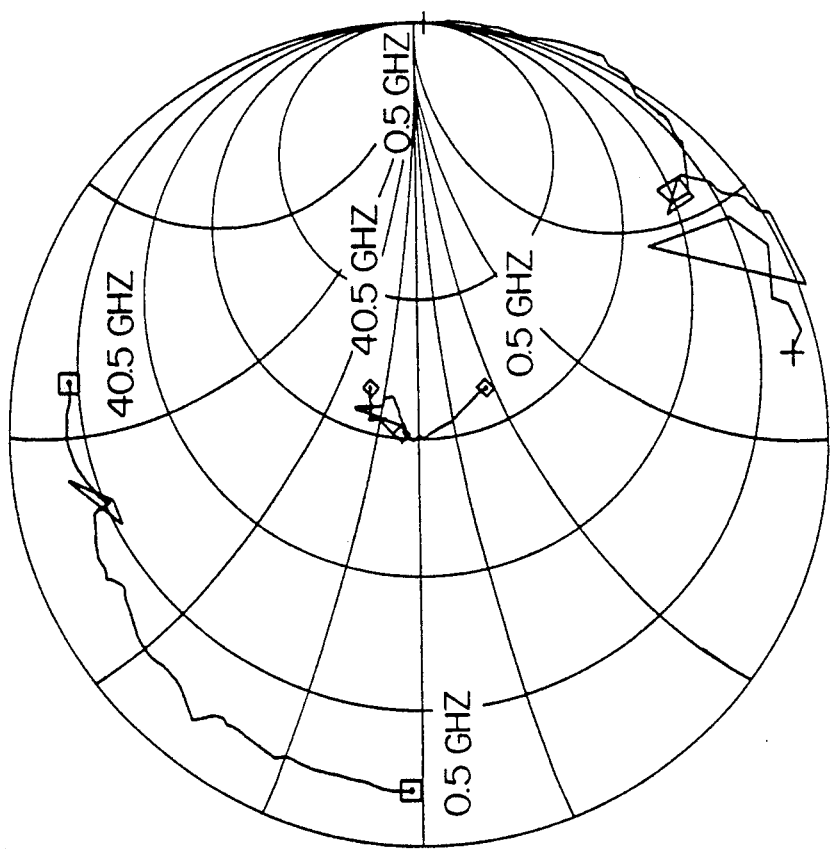
FIG. 3(b)
FIG. 3(a)

MMIC PACKAGE AND INTERCONNECT TEST FIXTURE

FIELD OF THE INVENTION

This invention relates generally to test fixtures for high frequency packages and interconnects and, more specifically, to a test fixture using the external reflection coefficients of a beam lead PIN diode at different bias states to determine the electrical parameters of such packages and interconnects.

BACKGROUND OF THE INVENTION

Monolithic microwave integrated circuit (MMIC) packaging and interconnects have a significant effect on the electrical performance of high frequency systems such as microwave systems and thus it is important to characterize microwave transitions independently of the embedded circuits.

In general, three different techniques have been developed for performing such characterizations of MMIC packaging and interconnects. The first technique determines bolometer mount efficiency by using radio frequency (RF) measurements of a barretter at different bias states to calculate the efficiency (Power$_{out}$/Power$_{in}$) of the mount. This is accomplished by varying the DC voltage on the bolometer mount and then computing the efficiency from the barretter resistance and the reflection coefficient for each DC operating point. One disadvantage is that the technique does not provide any information with respect to the scattering parameters (S-parameters) of the transition, and such S-parameter information is more useful to an engineer than the efficiency of the device. This technique is discussed in G. F. Engen, A Bolometer Mount Efficiency Measurement Technique, Journal of Research of the National Bureau of Standards, vol. 65C, no. 2, April–June 1961.

The second, and most popular, technique is to solder or epoxy into the MMIC package a test fixture which utilizes a single transmission line as a standard. By using only one line, the amount of information that can be obtained is limited and not enough information is provided to fully characterize the package transitions. To augment the information provided, a mathematical model must be created for the package in order to determine the S-parameters. Further, the use of a straight transmission line imposes two physical restrictions on the device being tested. First, the distance between the transitions must remain fixed for all devices being characterized. Second, the orientation of the transitions must be symmetrical about the axis of the line. These two restrictions impose the requirements that the number of transitions in a package must be even and a transition must be located opposite another transition at a fixed distance. This technique is discussed in P. B. Ross and B. D. Geller, A Broadband Microwave Test Fixture, *Microwave Journal*, Vol. 30, No. 5, May 1987, pp. 233–248.

The third technique uses a least-squares de-embedding algorithm to characterize microwave transitions from measured S-parameters. The characterization procedure outlined in the literature uses multiple insertions into the package. In many cases, however, the standards need to be soldered or epoxied into the package or interconnect. This makes insertion difficult and the use of multiple standards impractical. Multiple insertions also degrade the accuracy of the package or interconnect characterization. This technique is discussed in R. F. Bauer and P. Penfield, De-embedding and Unterminating, *IEEE Transactions on Microwave Theory and Techniques*, vol. MTT-22, no. 3, pp. 282–288, March 1974.

Several U.S. patents disclose test fixtures which use the second technique discussed above in the characterization of high frequency circuits. For example, U.S. Pat. No. 4,947,111 (Higman et al.) discloses a test fixture comprising a conductive alignment plate having a plurality of apertures therein which match the signal conductor pins of the MMIC package. Signal conductor pins pass through the apertures and form sections of a transmission line. The apertures are sized such that the impedance of these sections of the transmission line effectively matches the 50 ohm resistance of the internal interconnect to the MMICs within the package.

U.S. Pat. No. 4,980,636 (Romanofsky et al.) discloses a MMIC test fixture having a support structure which is spring biased for testing MMIC chips. A set of calibration standards are provided.

U.S. Pat. No. 4,897,601 (Hirsch et al.) discloses an apparatus for providing an RF contact between the ground plane surface of a MMIC chip and a test fixture. The apparatus utilizes a single transmission line to provide calibration standards for the MMIC chips.

U.S. Pat. No. 5,051,810 (Katoh) discloses a semiconductor device for performing frequency characteristic tests. The semiconductor has a substrate that includes input, output and grounding electrode pads which provide contact points for a probe needle of a conventional high frequency wafer probe.

U.S. Pat. No. 4,704,872 (Jones) discloses a thermally controlled transmit/receive (T/R) module test apparatus which enables acquiring MMIC T/R module data, such as S-parameters and noise figure as a function of thermal cycling.

SUMMARY OF THE INVENTION

In accordance with the invention, a characterization test fixture is provided which uses a single active device, preferably a beam lead PIN diode, to determine the electrical characteristics, e.g., the S-parameters, of a MMIC package or interconnect. The fixture is capable of providing, in effect, multiple standards with only a single insertion of the fixture and without fixing the port-to-port distance.

In accordance with a preferred embodiment, the test fixture comprises a U-shaped conductive ground plane having parallel arms defining a space therebetween. A center conductor is located in the space and is disposed in spaced relationship to the arms of the ground plane. A beam lead PIN diode is connected to the center conductor at one end thereof and to the ground plane at the other. An external variable DC voltage source is used to vary the bias state of the diode so that, when the fixture is inserted into a package or interconnect, reflection coefficient measurements for the different bias states can be obtained by an automatic network analyzer for use in calculations for determining the characteristics in question.

Other features and advantages of the invention will be set forth in, or apparent from, the following detailed description of preferred embodiments of the invention.

BRIEF DESCRIPTION OF THE DRAWINGS

FIGS. 3(a) and 3(b) are Smith Charts of the measured and modeled reflection coefficients of the test fixture of FIG. 1.

DESCRIPTION OF THE PREFERRED EMBODIMENTS

Figure 1:
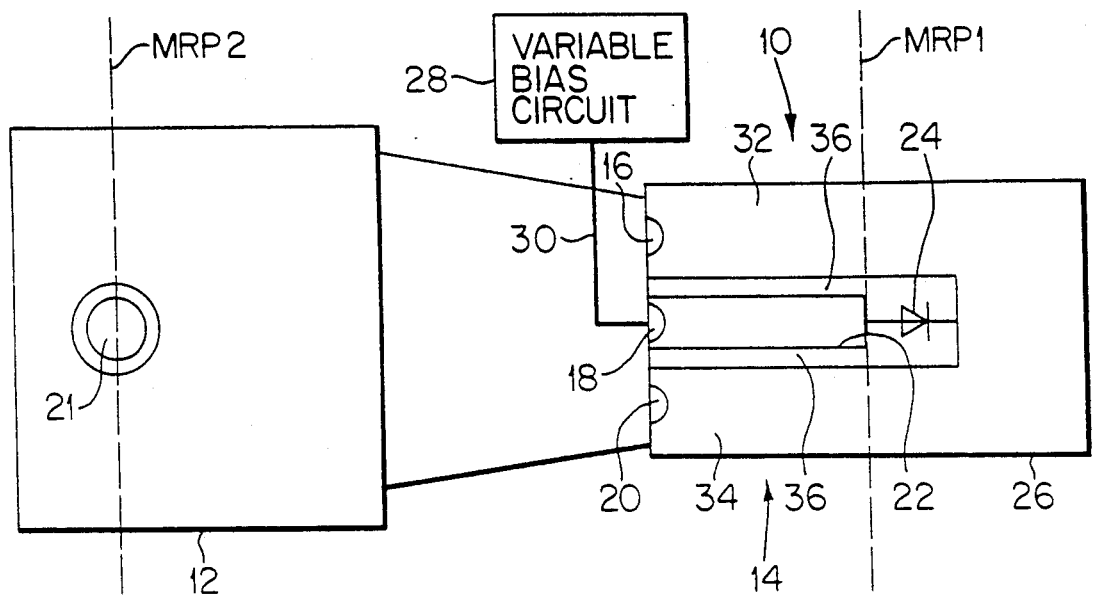
FIG. 1 is a top plan view of a characterization test fixture constructed in accordance with a preferred embodiment of the invention.

Referring to FIG. 1, there is shown a MMIC test fixture 10 which basically comprises a MMIC launch 14 and a beam lead PIN diode 24.

The probe head 12 is a conventional high frequency wafer probe which utilizes three micrometers to provide electrical connection between the microwave circuit and the MMIC launch 14. In a preferred embodiment, the probe head 12 is a commercially available probe head manufactured by Cascade Microtech of Beaverton, Oreg. To provide for the passage of RF energy from the microwave circuit to the MMIC launch 14, three conductive contacts, denoted 16, 18 and 20, respectively, are provided. Additionally, a coaxial connector 21 permits the RF energy signal to be displayed upon a conventional Automatic Network Analyzer (not shown).

The MMIC launch 14 comprises a planar member made of a conductive material, preferably an alumina substrate with a thin layer of gold film precoated thereon. A calibration set (not shown) and the MMIC launch 14 can be fabricated by etching the gold film off of the substrate. The launch 14 includes a center conductor 22 which is attached at one end to conductive contact 18. The other end of conductor 22 is connected to a beam lead PIN diode 24. In an exemplary embodiment, the center conductor 22 is 150 μm wide. Diode 24 is oriented so that the anode of diode 24 is connected to conductor 22 and the cathode of diode 24 is connected to the central portion of a U-shaped ground plane 26. A variable DC bias voltage source 28 is connected to the contact 18 (positive) and contact 16 (negative) as indicated schematically by connector 30 and 31, respectively. Source 28 is used to apply an adjustable DC bias voltage to diode 24.

Ground plane 26 is a U-shaped planar structure having parallel arms 32 and 34 which engage conductive contacts 16 and 20, respectively. The arms 32 and 34 are laterally spaced from the center conductor 22 and thus there is an air gap 36 on either side of conductor 22. In a preferred embodiment, each air gap 36 is 65 μm wide. Because RF energy must be transferred between the microwave circuit and MMIC launch 14, impedance matching is required. This is accomplished in launch 14 by selecting the width of the air gaps 36 and the width of the center conductor 22 such that a nominal impedance of 50 Ω is provided. It should be noted that the dimensions of the air gaps 36 and conductor 22 may be varied as long as the proper matching resistance is maintained and the center conductor 22 is made wide enough to allow the lead of diode 24 to be connected to the conductor 22.

Figure 2:
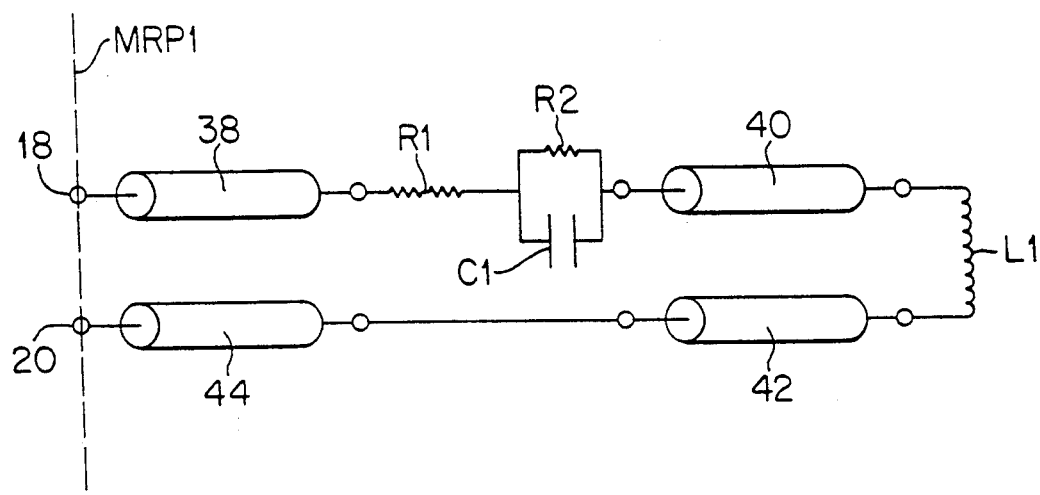
FIG. 2 is a circuit diagram which models the test fixture of FIG. 1.

FIG. 2 illustrates an equivalent circuit of the MMIC launch 14 and the diode 24 used to model the MMIC test fixture reflection coefficient and to extrapolate the performance of the preferred embodiment thereof to higher frequencies. The MMIC launch 14 is modeled as coplanar waveguide (CPW) having a length which is dependent upon the location of the measurement reference plane MRPI discussed below, a width of 150 μm, and a gap of 65 μm. The diode 24 is modeled as a series junction resistance, labeled R1 and having a value of 4 Ω, a shunt junction capacitance of 0.022 pF and labeled C1, and a DC bias-dependent resistance, labeled R2. The selected values used for R2 are 0Ω, 47.5 Ω, and ∞ when the diode 24 is forward, intermediate, and reverse biased, respectively. The leads of the diode 24 were modeled as two coplanar waveguides having a length of 175 μm, a width of 150 μm, and a gap of 65 μm, and are denoted 38 (anode) and 40 (cathode) in FIG. 2, while elements 44 and 42 are the respective ground planes. The CPW short is modeled as an inductance L1 and has a value of 0.035 nH.

FIGS. 3(a) and 3(b) illustrate on respective Smith charts the measured and modeled reflection coefficients when the diode 24 is in a forward biased state (represented by squares), an intermediate biased state (represented by diamonds), and a reverse biased state (represented by crosses). During the testing, the variable DC bias voltage source 28 was set at 1.03 V and 6.78 mA, 0.7 V and 0.015 mA, and −6 V for the forward bias, intermediate bias, and reverse bias states, respectively. As can be seen from FIGS. 3(a) and 3(b), the fit between the measured and modeled reflection coefficients of the diode 24 are quite good, except for the intermediate resistive state at very low frequencies. This discrepancy is due to charge storage effects which are not taken into account in the model of FIG. 2. The model predicts that the three bias states will remain widely separated on the Smith chart until about 80 GHz. This indicates that the MMIC test fixture 1 will be accurate up to about 80 Ghz but may be unsuitable for de-embedding at higher frequencies.

The de-embedding procedure will fail if the reflection coefficient of the diode 24 changes upon being soldered (via contacts 16, 18 and 20) into the package. An experiment was performed to test for the stability of the beam lead PIN diode 24 with respect to temperature cycling. The experiment began by measuring the reflection coefficient, in a conventional manner, for forward biased, unbiased, and intermediate biased states. The refection coefficients were calculated using a CPW calibration set and the least-squares de-embedding algorithm referred to above, then the absolute value of the difference was calculated from the first measurement. The results from the above step, conducted at a frequency of 40 GHz, is tabulated in the first row of Table 1 set forth below (the CONTROL row).

After performing the control measurement, the diode 24 was temperature cycled twice. A peak temperature of about 300° C. was maintained for at least one minute during the first cycle and a peak temperature of 290° C. was maintained for 20 minutes during the second cycle. After each temperature cycle, the reflection coefficients were measured and the absolute value of difference between the first and this measurement was calculated. This calculated value is tabulated in Table 1 in the second and third rows, respectively. This process was repeated for three other diodes. The first diode tested was a gallium arsenide beam lead PIN diode while the rest were silicon beam lead PIN diodes.

TABLE 1

| | Bias State | Diode #1 | Diode #2 | Diode #3 | Diode #4 |
|---|---|---|---|---|---|
| CONTROL | Forward | 0.017 | 0.008 | 0.002 | 0.004 |
| | Resistive | 0.002 | 0.003 | 0.004 | 0.004 |
| | No Bias | 0.002 | 0.015 | 0.006 | 0.002 |
| After 300° C. temp. cycle | Forward | 0.028 | 0.027 | 0.003 | 0.023 |
| | Resistive | 0.015 | 0.013 | 0.006 | 0.021 |
| | No Bias | 0.012 | 0.037 | 0.010 | 0.013 |
| After 290° C. temp. cycle | Forward | 0.058 | 0.029 | 0.022 | 0.027 |
| | Resistive | 0.013 | 0.012 | 0.022 | 0.025 |
| | No Bias | 0.013 | 0.033 | 0.030 | 0.015 |

As may be seen from Table 1, all of the diodes that were tested exhibit excellent temperature stability and thus, the de-embedding procedure is not affected by the change in temperature since the reflection coefficient of the diode 24 and the mount thereof do not change upon being soldered into the MMIC package.

Another important criterion for an active standard is linearity. If the power at which the reflection coefficient is measured is too high, the microwave impedance of the diode 24 will shift as the incident power changes which will, in turn, cause the de-embedding procedure to fail. Calibrations and measurements were performed at several incident power levels and it was found that the reflection coefficients of the diodes deviated from their extrapolated small signal value by less than 0.1% when the incident power was decreased to −30 dBm. This 0.1% deviation is acceptable and will not significantly affect the de-embedding procedure.

The possibility of errors being introduced by incident light falling upon the diode 24 was also investigated. An estimated 730 mW/cm$^2$ of white light incident on the wafer changed the magnitude of the reflection coefficient of the diode 24 by only $2.3 \times 10^{-5}$. This change is negligible and suggests that typical lighting will not significantly affect the diode impedance.

As explained above the MMIC test fixture 10 including beam lead PIN diode 24 is used to determine reflection coefficients by employing TRL calibration software, a CPW calibration set and a conventional automatic network analyzer. These reflection coefficients are, in turn, used in a conventional least-squares de-embedding algorithm (disclosed, e.g., in the Bauer and Penfield reference) to determine the electrical characteristics, e.g., S-parameters, of the MMIC package and interconnects. The characterization procedure has been verified (using diode #3 of Table 1) by employing the probe head 12 as the transition to be measured. In this testing, the IF averaging factor was set to 1000 and the incident power to −30 dBm. First, the reflection coefficient of diode 24 was measured when forward biased reverse biased and biassed in three different intermediate resistive states with respect to an on-wafer coplanar waveguide TRL (Thru-Reflect-Line) calibration and using the measurement reference plane indicated at MRP1 in FIG. 1. Next the reflection coefficients of the combination of the probe head 12 and MMIC test fixture 10 were measured, for the same five bias states, with respect to the probe head coaxial connection 21 and using the measurement reference plane indicated at MRP2. Subsequent to these measurements, the de-bedding algorithms referred to above (viz., those disclosed in the Bauer and Penfield reference) were applied to determine the S-parameters of the probe heads from the two sets of measurements. As mentioned above, the algorithm in question uses a least-squares fit to the redundant measurements.

To provide verification, the experiment was repeated using a two-tier TRL calibration wherein the same procedure was used except that a TRL standard set was substituted for the MMIC test fixture 10 and a TRL algorithm (see R. Marks and K. Phillips, "Wafer-level ANA Calibrations at NIST," 34th ARFTG Conference Digest, 1989) was used to de-embed the S-parameters of the probe head.

Although the present invention has been described to specific exemplary embodiments thereof, it will be understood by those skilled in the art that variations and modifications can be effected in these exemplary embodiments without departing from the scope and spirit of the invention.

What is claimed is:

1. A test fixture for determining the S-parameters of MMIC packages and interconnects, said test fixture comprising:
   a U-shaped conductive ground plane comprising a central portion and a pair of parallel arms extending outwardly from said central portion so as to define a space between said arms;
   a center conductor located in said space; and
   a beam lead PIN diode located in said space and having an anode connected to said center conductor and a cathode connected to said ground plane.

2. The test fixture recited in claim 1 wherein said test fixture is fabricated such that a wafer probe can be connected to said arms of said U-shaped conductive ground plane and to said center conductor by respective conductive contacts.

3. The test fixture recited in claim 1 wherein said ground plane and said center conductor comprise an alumina substrate coated with a thin layer of gold.

4. The test fixture recited in claim 1 wherein said center conductor is about 150 μm wide and is disposed relative to said arms of said U shaped conductive ground plane so as to leave a gap of about 65 μm on either side of said center conductor.

5. The test fixture recited in claim 1 further including a variable DC voltage source, connected to said diode, for varying the bias voltage on said diode.

6. A test fixture for determining the S-parameters of MMIC packages and interconnects, said test fixture comprising:
   a U-shaped conductive ground plane including a base portion and a pair of parallel arms defining a space therebetween;
   a center conductor located in said space between said arms in spaced relationship to said arms so that a gap is provided on either side of said center conductor;
   a beam lead PIN diode located in said space and including an anode connected to said center conductor and a cathode connected to the base portion of said ground plane; and
   means for connecting a variable DC voltage source to said diode through said center conductor for varying the bias voltage on said diode.

7. A test fixture for enabling a determination of the electrical characteristics of high frequency packages and interconnects, said test fixture comprising:
   a beam lead PIN diode;
   contacts of a wafer probe, and a MMIC launch, said MMIC launch comprising:

a diode mount for said diode connected to said contacts of said wafer probe; and said text fixture further including means for varying the impedance of said diode so as to enable measurements of the diode reflection coefficients to be carried out for different bias states of the diode so as to provide, in effect, multiple high-frequency standards using only a single fixture.

8. A test fixture as claimed in claim 7 wherein said diode mount comprises a coplanar waveguide launch structure terminated by said diode.

9. A test fixture as claimed in claim 8 wherein said launch structure comprises a U-shaped ground plane including spaced arms, and a central conductor disposed between said arms, and wherein said diode is connected between said conductor and said ground plane.

10. A test fixture as claimed in claim 9 wherein said diode comprises a silicon beam lead PIN diode.

11. A test fixture as claimed in claim 9 wherein said diode comprises a gallium arsenide beam lead PIN diode.

12. A test fixture for enabling a determination of the S-parameters of high frequency packages of interconnects, said test fixture comprising:

a beam lead PIN diode; and a MMIC launch, said MMIC launch comprising:

a diode mount for said diode adapted to be connected to a wafer probe; and said test fixture further comprising means for varying the impedance of said diode so as to enable measurements of the diode reflection coefficients to be carried out for different bias states of the diode so as to provide, in effect, multiple high-frequency standards using only a single fixture.

* * * * *